(12) United States Patent
Galy et al.

(10) Patent No.: US 8,598,938 B2
(45) Date of Patent: Dec. 3, 2013

(54) POWER SWITCH

(71) Applicant: STMicroelectronics SA, Montrouge (FR)

(72) Inventors: Philippe Galy, Le Touvet (FR); Johan Bourgeat, Allevard (FR)

(73) Assignee: STMicroelectronics SA, Montrouge (FR)

( * ) Notice: Subject to any disclaimer, the term of this patent is extended or adjusted under 35 U.S.C. 154(b) by 0 days.

(21) Appl. No.: 13/666,727

(22) Filed: Nov. 1, 2012

(65) Prior Publication Data

US 2013/0120049 A1 May 16, 2013

(30) Foreign Application Priority Data

Nov. 15, 2011 (FR) ...................................... 11 60349

(51) Int. Cl.
*H03K 17/687* (2006.01)
(52) U.S. Cl.
USPC .......................................... 327/427; 327/534
(58) Field of Classification Search
USPC ................................................. 327/427, 534
See application file for complete search history.

(56) References Cited

U.S. PATENT DOCUMENTS

| 5,811,857 | A  | * | 9/1998  | Assaderaghi et al. | ......... | 257/355 |
| 6,191,615 | B1 | * | 2/2001  | Koga               | .............. | 326/81  |
| 7,151,402 | B2 | * | 12/2006 | Peron et al.       | ................... | 327/476 |
| 2003/0011949 | A1 | * | 1/2003 | Ker et al.          | ........................ | 361/56  |

FOREIGN PATENT DOCUMENTS

WO    WO 2011/089179 A1    7/2011

* cited by examiner

*Primary Examiner* — Long Nguyen
*Assistant Examiner* — Patrick Chen
(74) *Attorney, Agent, or Firm* — Slater & Matsil, L.L.P.

(57) ABSTRACT

A power switch includes first and second MOS transistors in series between first and second nodes. Both the first and second transistors have a gate coupled to its substrate. First and second resistive elements are coupled between the gate of the first transistor and the first node, and between the gate of the second transistor and the second node, respectively. A triac is coupled between the first and second nodes. The gate of the triac is coupled to a third node common to the first and second transistors. A third MOS transistor has a first conduction electrode coupled to the gate of the first transistor and a second conduction electrode coupled to the gate of the second transistor.

20 Claims, 1 Drawing Sheet

POWER SWITCH

This application claims the priority benefit of French patent application number 1160349, filed on Nov. 15, 2011, which is hereby incorporated by reference to the maximum extent allowable by law.

TECHNICAL FIELD

The present invention generally relates to electronic circuits. Specific embodiments relate to the field of electronic power switches, e.g., electrically-controlled switches capable of withstanding relatively high voltages in the off state and of conducting relatively high currents in the on state.

BACKGROUND

The use of a MOS transistor as a power switch is known, for example, to block or restore a power supply current flow in an electric circuit. As an example, a MOS transistor may be used to control a lamp or a motor in series with the transistor, the assembly receiving a D.C. or A.C. power supply voltage. The MOS transistors used as power switches may be discrete components or integrated components (for example, in a semiconductor chip formed in CMOS technology).

A disadvantage of this type of switches is that a large semiconductor surface is necessary to be able to form a MOS transistor capable of withstanding high voltages and of conducting high currents.

Further, in the on state, MOS transistors have non-negligible leakage currents, thus causing an unwanted power loss.

SUMMARY OF THE INVENTION

Thus, an embodiment provides a power switch overcoming at least some of the disadvantages of known switches.

Another embodiment provides a power switch taking up, for an identical or equivalent breakdown voltage, a smaller surface area than MOS transistor switches.

Another embodiment provides a power switch having lower leakage currents than MOS transistor switches.

Another embodiment provides a symmetrical switch, that is, a switch capable of being controlled to be turned on whatever the sign of the voltage thereacross in the off state.

Another embodiment provides a power switch capable of being integrated to a semiconductor chip made in CMOS technology.

Another embodiment provides a power switch capable of being used as a power removal element in the occurrence of an abrupt overvoltage (electrostatic discharge) thereacross.

Thus, an embodiment provides a power switch comprising first and second MOS transistors in series between first and second nodes, each of the first and second transistors having its gate coupled to its substrate. First and second resistive elements are respectively coupled between the gate of the first transistor and the first node, and between the gate of the second transistor and the second node. A triac is coupled between the first and second nodes. The gate of the triac is coupled to a third node common to the first and second transistors. A third MOS transistor has a first conduction electrode coupled to the gate of the first transistor and a second conduction electrode coupled to the gate of the second transistor.

According to an embodiment, the gate and the substrate of the first transistor are not directly connected to one or the other of its conduction electrodes, and the gate and the substrate of the second transistor are not directly connected to one or the other of its conduction electrodes.

According to an embodiment, the first, second and third transistors are N-channel MOS transistors.

According to an embodiment, the switch comprises at least one first control terminal coupled to the gate of the third transistor.

According to an embodiment, the switch comprises at least one second control terminal coupled to the substrate of the third transistor.

According to an embodiment, the switch further comprises a first controlled diode having its anode coupled to the first node and having its cathode coupled to the third node. A second controlled diode has its anode coupled to the second node and has its cathode coupled to the third node. A control gate of the first diode is coupled to the gate of the first transistor, and a control gate of the second diode is coupled to the gate of the second transistor.

According to an embodiment, the third transistor is controlled by application of a control signal referenced with respect to a fourth node distinct from the first, second, and third nodes.

Another embodiment provides using a transistor of the above-mentioned type to control a load powered with a D.C. voltage.

Another embodiment provides using a transistor of the above-mentioned type to control a load powered with an A.C. voltage.

Another embodiment provides using a transistor of the above-mentioned type to switch electric power supply sources.

Another embodiment provides an integrated circuit made in CMOS technology, comprising a switch of the above-mentioned type.

The foregoing and other features and advantages will be discussed in detail in the following non-limiting description of specific embodiments in connection with the accompanying drawings.

DETAILED DESCRIPTION OF ILLUSTRATIVE EMBODIMENTS

Figure 1:
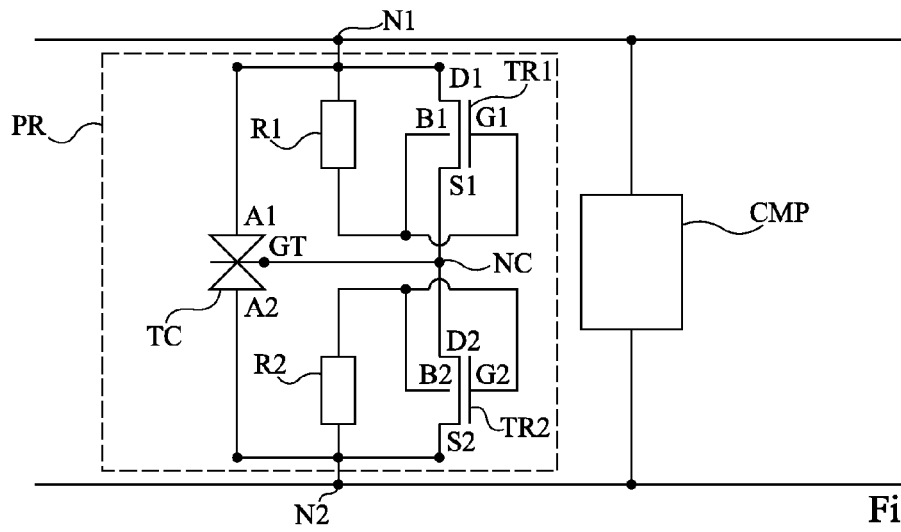
FIG. 1 is an electric diagram illustrating an embodiment of a circuit comprising a component and a device for protecting this component against electrostatic discharges.

For clarity, the same elements have been designated with the same reference numerals in the different drawings. Further, only those elements which are useful to the understanding of the present disclosure have been shown and will be described hereafter. In particular, the devices used to deliver a control signal to the switch have not been detailed, the described embodiments being compatible with usual control devices (photodetector, microcontroller, etc.).

FIG. 1 is an electric diagram illustrating an embodiment of a circuit comprising a component CMP and a device PR for protecting this component against electrostatic discharges. Component CMP is connected between terminals or nodes N1 and N2 of the circuit, for example, respective high and low power supply terminals of the circuit.

Protection device PR comprises a triac TC having a first conduction electrode A1 coupled to node N1 and having its second conduction electrode A2 coupled to node N2. Gate GT of triac TC, which is the N-type gate of the triac in the present example, is coupled to a node NC of device PR. In the shown example, terminals A1 and A2 and gate GT are directly connected, respectively, to nodes N1, N2, and NC.

Device PR further comprises transistors TR1 and TR2 in series between nodes N1 and N2. First and second conduction electrodes D1 and S1 of transistor TR1 are coupled to nodes N1 and NC, respectively, and first and second conduction electrodes D2 and S2 of transistor TR2 are coupled to nodes NC and N2, respectively. It should be noted that the electrodes connected to the source and drain regions of a MOS transistor are called conduction electrodes of this transistor. Those skilled in the art know that the structure of a MOS transistor is symmetrical with respect to its two conduction electrodes and that in practice, the drain is designated as being the electrode taken to a high potential with respect to a low potential applied on the other electrode, which is then designated as the source.

In the shown example, transistors TR1 and TR2 are N-channel MOS transistors. Further, in this example, electrodes D1 and S1 are directly connected to nodes N1 and NC, respectively, and electrodes D2 and S2 are directly connected to nodes NC and N2, respectively. Transistor TR1 has its gate G1 coupled to its substrate B1, where gate G1 and substrate B1 are not directly connected to one or the other of electrodes D1 and S1. Similarly, transistor TR2 has its gate G2 coupled to its substrate B2, where gate G2 and substrate B2 are not directly connected to one or the other of electrodes D2 and S2. In this example, transistor TR1 has its gate G1 directly connected to its substrate B1, and transistor TR2 has its gate G2 directly connected to its substrate B2. Device PR further comprises a resistive element R1 coupled between substrate B1 of transistor TR1 and node N1, and a resistive element R2 coupled between substrate B2 of transistor TR2 and node N2.

The operation of protection device PR is discussed in detail in French patent application 1054363 filed on Jun. 3, 2010 and published as FR2961056 on Dec. 12, 2011 (and incorporated herein by reference), and more specifically in relation with FIGS. 14 and 22 of this patent application. Device PR uses the principle of a hybrid operation of a MOS transistor, which has been discussed in P. Galy and V. Berland, "Ideal Gummel curves simulation of high current gain vertical NPN BIMOS transistor", INT. J. ELECTRONICS, 1996, vol. 80 No. 6,717-726, and having its application to the protection of a component against electrostatic discharges described in the above-mentioned French patent application.

In the presence of a positive electrostatic discharge between nodes N1 and N2, that is, a discharge giving rise to a positive potential difference between nodes N1 and N2 (current pulse from node N1 to node N2), the circuit comprising transistors TR1 and TR2 and resistors R1 and R2 behaves as a trigger, causing the turning-on of the triac, which enables to remove the electrostatic discharge.

Because triac TC and MOS transistors are symmetrical structures, device PR behaves symmetrically in the presence of a negative electrostatic discharge between nodes N1 and N2. That is, it removes the discharge before the latter damages component CMP.

In steady state, that is, when component CMP is in operation, with for example high and low power supply voltages respectively present on nodes N1 and N2, electrodes D1 and S1 respectively form the drain and the source of transistor TR1, and electrodes D2 and S2 respectively form the drain and the source of transistor TR2. Resistor R1 and the (conductive) substrate-source PN junction of transistor TR1 pull up the voltage of node NC to a high level. The PN substrate-drain junction of transistor TR2 is non-conductive since the potential of bulk B2 of transistor TR2 is pulled down to a low level via resistor R2 connected to node V2. The voltage of gate G2 of transistor TR2 is also pulled down to a low level via resistor R2. Transistor TR2 is thus off, which prevents any starting of device PR.

Due to the symmetry of the structure, device PR has a similar behavior if the high and low power supply voltages are reversed. That is, the device remains off in steady state.

As explained in the above-mentioned French patent application, protection device PR is particularly well adapted to an integration in semiconductor chips formed in advanced CMOS technologies, for example, below 1 micrometer, and more significantly still in technologies below 65 nanometers, for example, 45-nanometer and 32-nanometer technologies. Indeed, such technologies give more importance to the parasitic bipolar behavior of the MOS transistor, which favors the hybrid operation of transistors TR1 and TR2 for a fast triggering of the protection in the occurrence of an electrostatic discharge.

According to an aspect of an embodiment, it is provided to modify device PR of FIG. 1 to form a power switch capable of being controlled to be turned on in steady state.

Figure 2:
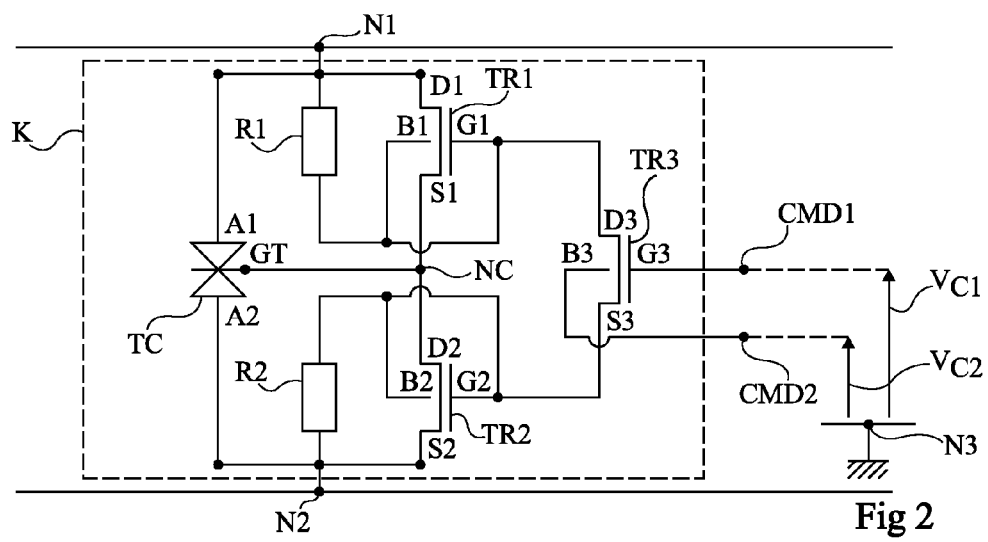
FIG. 2 is an electric diagram illustrating an embodiment of a power switch.

FIG. 2 is an electric diagram illustrating an embodiment of a power switch K, that is, a switch capable of switching currents on the order of 100 mA or more, connected between nodes N1 and N2 of a circuit, where nodes N1 and N2 may be coupled, directly or indirectly (for example, via a load), to power supply terminals of the circuit.

Switch K comprises the same elements as device PR of FIG. 1, arranged in the same way between nodes N1 and N2, and further comprises a MOS transistor TR3 having a first conduction electrode D3 coupled to gate G1 of transistor TR1 and having its second conduction electrode S3 coupled to gate G2 of transistor TR2. In the shown example, transistor TR3 is an N-channel transistor. Further, in this example, electrodes D3 and S3 of transistor TR3 are directly connected, respectively, to gate G1 of transistor TR1 and to gate G2 of transistor TR2. A first control node CMD1 of switch K is coupled to gate G3 of transistor TR3 and a second control node CMD2 of switch K is coupled to substrate B3 of transistor TR3, where gate G3 and substrate B3 are not directly connected to one or the other of electrodes D3 and S3.

In steady state, for example, when a positive D.C. voltage is applied between nodes N1 and N2, if transistor TR3 is maintained off (non-conductive), switch K has the same behavior as device PR of FIG. 1 in steady state, that is, it remains off. The voltage of electrodes D3 and S3 of transistor TR3 are respectively pulled up to a high level via resistor R1 and pulled down to a low level via resistor R2.

If transistor TR3 is on, the voltage of gate G2 of transistor TR2 is taken back to a high level with respect to the voltage of source S2 of this transistor, which is coupled to low-voltage node N2. This turns on transistor TR2 and causes the flowing of a current between nodes N1 and N2, through the PN junction between terminal A1 and gate GT of the triac, and through transistor TR2. This current triggers the triac, that is, it turns on switch K.

Once triac TC has been triggered, it only turns off when the current flowing therethrough becomes lower than a threshold.

If the power supply voltage of the circuit comprising switch K is a D.C. voltage, and if it is also desired to be able to control the turning-off of switch K, an additional device, not shown, capable of at least temporarily interrupting the current flow between nodes N1 and N2, must be provided.

This additional device may be an electrically-controlled device, or a mechanical switch.

As an example, a possible application of switch K is the starting of an alarm (light, sound, or other) for a given event, for example, the detection of someone inside of a building by means of a photodetector. Once started, the alarm can only be stopped by the actuation of a mechanical switch configured to interrupt the current flow in the triac.

If the power supply voltage of the circuit comprising switch K is an A.C. voltage, the triac automatically turns off on each zero crossing of the A.C. voltage. It is thus not necessary to provide an additional device to turn off the triac after it has been turned on. Switch K may for example be used to control the power supplied to a load in series with the switch, the assembly receiving the A.C. power supply voltage. The moment in each halfwave (positive and/or negative) at which K is made conductive determines the power supplied to the load. In particular, a starting at the beginning of a halfwave amounts to supplying more power than a starting at the end of a halfwave.

In the shown example, switch K comprises two control nodes CMD1 and CMD2, each enabling to turn on and to turn off transistor TR3. Call $V_{C1}$ the control voltage applied between node CMD1 (coupled to gate G1) and a ground node N3 of the circuit, and $V_{C2}$ the control voltage applied between node CMD2 (coupled to gate G2) and ground N3.

In a first example, node CM2 is connected to ground N3, that is, voltage $V_{C2}$ is always zero, and transistor TR3 is controlled by varying voltage $V_{C1}$. When voltage $V_{C1}$ is in a low state (for example, 0 volt), transistor TR3 is non-conductive, and when voltage $V_{C1}$ is in a high state (for example, on the order of 1.5 volt), transistor TR3 is conductive. This corresponds to a conventional N-channel MOS transistor control mode.

In a second example, nodes CMD1 and CMD2 are interconnected, that is, voltages $V_{C1}$ and $V_{C2}$ are identical. When voltages $V_{C1}$ and $V_{C2}$ are in a low state (for example, 0 volt), transistor TR3 is non-conductive, and when voltages $V_{C1}$ and $V_{C2}$ are in a high state (for example, on the order of 1.5 volt), transistor TR3 is conductive. As it is being turned on, transistor TR3 having its substrate biased to a positive voltage transits through a hybrid operation, that is, an operation in which both the MOS transistor and the parasitic bipolar transistor associated with the MOS transistor are exploited. This enables to turn on the transistor faster than in a conventional MOS operation.

In a third example, node CMD1 is connected to ground N3, that is, voltage $V_{C1}$ is always zero, and transistor TR3 is controlled by varying voltage $V_{C2}$. When voltage $V_{C2}$ is in a low state (for example, 0 volt), transistor TR3 is non-conductive, and when voltage $V_{C2}$ is in a high state (for example, on the order of 1.5 volt), the parasitic bipolar transistor of transistor TR3, having its base, its emitter, and its collector respectively corresponding to the substrate, to the source, and to the drain of the MOS transistor, becomes conductive. A difference with respect to the first example (conventional MOS operation) is that the control of the parasitic bipolar transistor of transistor TR3 is a current control (injection of a base-emitter current), and not a voltage control (positive gate-source voltage).

More generally, it will be within the abilities of those skilled in the art to select the control mode of transistor TR3 adapted to the constraints of the application, and especially adapted to the characteristics of the control circuit (not shown) of the switch, and to the desired switching speed. Those skilled in the art may use a conventional (N-channel or P-channel) MOS transistor TR3 comprising a single control terminal, for example, coupled to its gate.

In the shown example, control signals $V_{C1}$ and $V_{C2}$ applied to transistor TR3 are referenced with respect to a ground node N3 of the circuit, distinct from nodes N1 and N2. This allows a perfectly symmetrical operation of the switch, in the case where the sign of the voltage between nodes N1 and N2 would be inverted, or in the case where the circuit or the circuit branch comprising switch K receives an A.C. power supply voltage. In other words, the use of a reference node distinct from nodes N1 and N2 enables to control the switch whatever the sign of the voltage between nodes N1 and N2.

However, if the power supply voltage of the circuit comprising the switch is always positive, or if, in the case of a circuit powered with an A.C. voltage, it is provided to only turn on switch K in positive halfwaves, that is, when a positive voltage is present between nodes N1 and N2, the control signals of transistor TR3 may be referenced with respect to node N2. Conversely, if it is provided to only turn on switch K when a negative voltage is present between terminals N1 and N2, the control signals of transistor TR3 may be referenced with respect to node N1.

In a specific embodiment, transistor K is formed in 32-nanometer CMOS technology, and sees, in operation, a voltage on the order of 2 volts between its terminals (in the off state), and conducts currents on the order of 300 milliamperes (in the on state). Transistors TR1, TR2, and TR3 are for example formed with the smallest gate length available in the technology, and with a gate length on the order of 10 micrometers. Resistors R1 and R2 for example have a value on the order of 1,000 ohms. Triac TC, which is a double P-N-P-N structure, for example comprises two fingers integrated within two semiconductor wells. It is advantageously provided to form transistors TR1, TR2, and TR3, and resistive elements R1 and R2 within the two wells containing the triac. The described embodiments are however not limited to this specific example.

An advantage of the embodiment described in relation with FIG. 2 is that, for an identical breakdown voltage, switch K takes up a much smaller silicon surface area than a switch using a MOS transistor as a power component. As an example, for an identical breakdown voltage, a MOS transistor takes up a silicon surface area from 10 to 20 times larger than a triac. Further, the surface area taken up by transistors TR1, TR2, and TR3, which are not power components, is negligible as compared with the surface area taken up by the triac.

Another advantage of switch K is that leakage currents are significantly decreased with respect to a switch using a MOS transistor as a power component.

Another advantage of switch K is that it is protected against possible electrostatic discharges which might occur thereacross. Indeed, if an electrostatic discharge occurs while transistor TR3 is non-conductive, switch K will have the same dynamic operation as device PR of FIG. 1, that is, the turning-on of triac TC will be automatically detected, thus enabling to remove the overvoltage.

Figure 3:
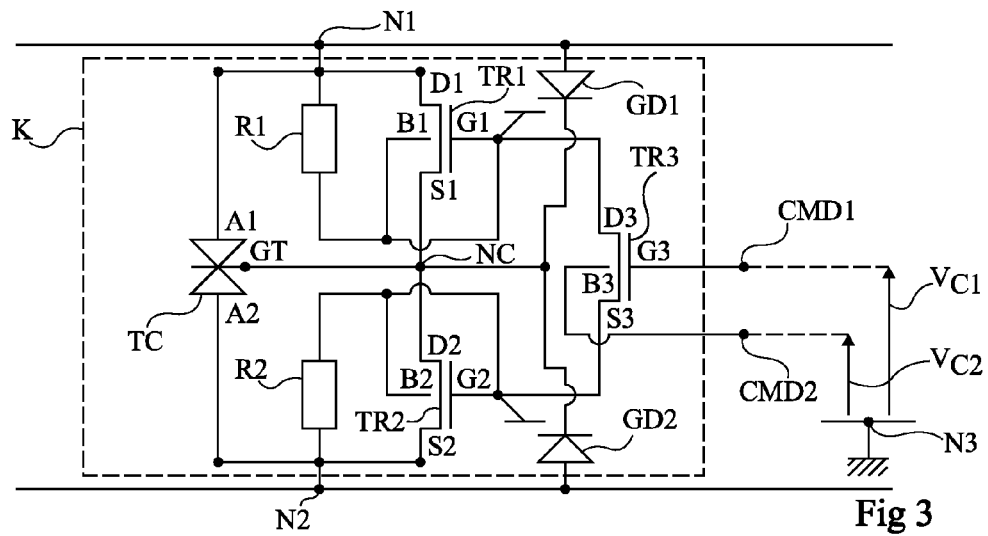
FIG. 3 is an electric diagram illustrating an alternative embodiment of the switch of FIG. 2.

FIG. 3 is an electric diagram illustrating an alternative embodiment of switch K of FIG. 2. The diagram of FIG. 3 comprises the same elements as the diagram of FIG. 2. It differs from the diagram of FIG. 2 in that it further comprises a first control diode GD1 having its anode coupled to node N1 and having its cathode coupled to node NC, and a second controlled diode GD2 having its anode coupled to node N2 and having its cathode coupled to node NC. Diode GD1 comprises a control gate coupled to gate G1 of transistor TR1 and diode GD2 comprises a control gate coupled to gate G2 of transistor TR2. In this example, the anodes of diodes GD1 and GD2 are directly respectively connected to node N1 and to node N2, and the cathodes of diodes GD1 and GD2 are directly connected to node NC.

Diodes GD1 and GD2 enable to adjust the sensitivity of the triggering in case of an electrostatic discharge (when transistor TR3 is off). Diodes GD1 and GD2 especially enable to avoid unwanted triggering in the occurrence of parasitic noise on the signal seen by nodes N1 and N2.

Specific embodiments of the present invention have been described. Various alterations, modifications and improvements will readily occur to those skilled in the art.

In particular, the described embodiments are not limited to the examples of application mentioned hereinabove in which switch K is used to control a load in series with the switch, the assembly receiving a D.C. or A.C. power supply voltage. Switch K may be used in any other configuration, for example, in power management systems to switch electric power sources of a device comprising several distinct sources (several batteries, for example).

Further, although the described embodiments are particularly well adapted to an integration in a semiconductor chip made in CMOS technology, they are not limited to this specific case. Switch K may also be formed by using discrete components, for example in high-power applications, to control loads powered with the mains voltage of the electric distribution network.

Further, the described embodiments are not limited to the case where transistors TR1, TR2, and TR3 are N-channel MOS transistors. It will be within the abilities of those skilled in the art to implement the desired operation by using P-channel transistors. It should however be noted that in advanced CMOS technology, the N-channel transistors have the advantage of being smaller and faster than P-channel transistors.

Such alterations, modifications, and improvements are intended to be part of this disclosure, and are intended to be within the spirit and the scope of the present invention. Accordingly, the foregoing description is by way of example only and is not intended to be limiting. The present invention is limited only as defined in the following claims and the equivalents thereto.

What is claimed is:

1. A power switch comprising:
   a first MOS transistor having a gate coupled to a body region;
   a second MOS transistor having a gate coupled to a body region, the first and second MOS transistors being coupled in series between a first node and a second node;
   a first resistive element coupled between the gate of the first transistor and the first node;
   a second resistive element coupled between the gate of the second transistor and the second node;
   a triac coupled between the first node and the second node, a gate of the triac being coupled to a third node that is common to the first and second transistors; and
   a third MOS transistor having a first conduction electrode coupled to the gate of the first transistor and a second conduction electrode coupled to the gate of the second transistor.

2. The switch of claim 1, wherein the first transistor has a first conduction electrode coupled to the first node and a second conduction electrode coupled to the third node and wherein the second transistor has a first conduction electrode coupled to the third node and a second conduction electrode coupled to the second node.

3. The switch of claim 2, wherein the gate and the body region of the first transistor are not directly connected to either the first or second conduction electrode of the first transistor, and wherein the gate and the body region of the second transistor are not directly connected to either the first or second conduction electrode of the second transistor.

4. The switch of claim 1, wherein the first, second and third transistors are N-channel MOS transistors.

5. The switch of claim 1, further comprising a first control terminal coupled to a gate of the third transistor.

6. The switch of claim 5, further comprising a second control terminal coupled to a body region of the third transistor.

7. The switch of claim 1, further comprising:
   a first controlled diode having an anode coupled to the first node and a cathode coupled to the third node, wherein a control gate of the first diode is coupled to the gate of the first transistor; and
   a second controlled diode having an anode coupled to the second node and a cathode couple to the third node, wherein a control gate of the second diode is coupled to the gate of the second transistor.

8. The switch of claim 1, wherein the third transistor is controlled by application of a control signal referenced with respect to a fourth node that is distinct from the first, second, and third nodes.

9. The switch of claim 1, wherein the switch is configured to control a load powered with a D.C. voltage.

10. The switch of claim 1, wherein the switch is configured to control a load powered with an A.C. voltage.

11. The switch of claim 1, wherein the switch is configured to switch electric power supply sources.

12. The switch of claim 1, wherein the switch integrated onto a chip that includes circuitry formed in CMOS technology.

13. A method of operating a switch, the method comprising:
   providing a switch, the switch comprising:
      a first MOS transistor having a gate coupled to a body region
      a second MOS transistor having a gate coupled to a body region, the first and second MOS transistors being coupled in series between a first node and a second node;
      a first resistive element coupled between the gate of the first transistor and the first node;
      a second resistive element coupled between the gate of the second transistor and the second node;
      a triac coupled between the first node and the second node, a gate of the triac being coupled to a third node that is common to the first and second transistors; and
      a third MOS transistor having a first conduction electrode coupled to the gate of the first transistor and a second conduction electrode coupled to the gate of the second transistor, the third transistor further comprising a gate and a body region; and
   applying a control signal to either the gate and/or the body region of the third transistor.

14. The method of claim 13, wherein applying the control signal comprises applying a first control signal to the gate of the third transistor and applying a second control signal to the body region of the third transistor.

15. The method of claim 13, wherein applying the control signal comprises applying the control signal to the gate of the third transistor.

16. The method of claim 13, wherein applying the control signal comprises applying the control signal to the body region of the third transistor.

17. The method of claim 13, wherein the first and second nodes are coupled across a D.C. voltage load.

18. The method of claim 13, wherein the first and second nodes are coupled across an A.C. voltage load.

19. The method of claim 13, wherein the control signal is referenced with respect to a fourth node that is distinct from the first, second, and third nodes.

20. The method of claim 13, wherein the switch further comprises:
 a first controlled diode having an anode coupled to the first node and a cathode coupled to the third node, wherein a control gate of the first diode is coupled to the gate of the first transistor; and
 a second controlled diode having an anode coupled to the second node and a cathode couple to the third node, wherein a control gate of the second diode is coupled to the gate of the second transistor.

* * * * *